(12) United States Patent
Mosso et al.

(10) Patent No.: US 10,044,046 B2
(45) Date of Patent: Aug. 7, 2018

(54) DEPOSITION ON TWO SIDES OF A WEB

(71) Applicant: Amprius,Inc., Sunnyvale, CA (US)

(72) Inventors: Ronald J. Mosso, Fremont, CA (US); Ghyrn E. Loveness, Mountain View, CA (US)

(73) Assignee: Amprius, Inc., Sunnyvale, CA (US)

( * ) Notice: Subject to any disclaimer, the term of this patent is extended or adjusted under 35 U.S.C. 154(b) by 721 days.

(21) Appl. No.: 14/252,633

(22) Filed: Apr. 14, 2014

(65) Prior Publication Data

US 2014/0302232 A1 Oct. 9, 2014

Related U.S. Application Data

(62) Division of application No. 12/637,727, filed on Dec. 14, 2009, now abandoned.

(51) Int. Cl.
*C23C 16/00* (2006.01)
*H01M 6/40* (2006.01)
(Continued)

(52) U.S. Cl.
CPC .......... *H01M 6/40* (2013.01); *C23C 16/0209* (2013.01); *C23C 16/0272* (2013.01); *C23C 16/042* (2013.01); *C23C 16/22* (2013.01); *C23C 16/24* (2013.01); *C23C 16/26* (2013.01); *C23C 16/42* (2013.01); *C23C 16/52* (2013.01); *C23C 16/545* (2013.01); *C23C 16/56* (2013.01); *H01M 4/0421* (2013.01); *H01M 4/139* (2013.01); *H01M 4/386* (2013.01); *B05D 1/62* (2013.01); *B05D 2252/02* (2013.01); *B05D 2252/10* (2013.01);
(Continued)

(58) Field of Classification Search
CPC ... C23C 16/52; C23C 16/0209; C23C 16/545; C23C 16/42; C23C 16/23; C23C 16/22; C23C 16/042; C23C 16/0272
See application file for complete search history.

(56) References Cited

U.S. PATENT DOCUMENTS 4,366,215 A 12/1982 Coetzer et al.
4,466,258 A 8/1984 Sando et al.
(Continued)

FOREIGN PATENT DOCUMENTS

CN 1705418 A 12/2005
CN 1979828 A 6/2007
(Continued)

OTHER PUBLICATIONS

U.S. Office Action dated Jan. 29, 2013, issued in U.S. Appl. No. 12/637,727.
(Continued)

*Primary Examiner* — Kelly M Gambetta
(74) *Attorney, Agent, or Firm* — Weaver Austin Villeneuve & Sampson LLP

(57) ABSTRACT

Apparatuses and methods for depositing materials on both side of a web while it passes a substantially vertical direction are provided. In particular embodiments, a web does not contact any hardware components during the deposition. A web may be supported before and after the deposition chamber but not inside the deposition chamber. At such support points, the web may be exposed to different conditions (e.g., temperature) than during the deposition.

27 Claims, 7 Drawing Sheets

(51) Int. Cl.

| | |
|---|---|
| *C23C 16/02* | (2006.01) |
| *C23C 16/52* | (2006.01) |
| *C23C 16/54* | (2006.01) |
| *C23C 16/56* | (2006.01) |
| *H01M 4/04* | (2006.01) |
| *H01M 4/139* | (2010.01) |
| *H01M 4/38* | (2006.01) |
| *C23C 16/04* | (2006.01) |
| *C23C 16/22* | (2006.01) |
| *C23C 16/24* | (2006.01) |
| *C23C 16/26* | (2006.01) |
| *C23C 16/42* | (2006.01) |
| *B05D 1/00* | (2006.01) |
| *H01M 4/36* | (2006.01) |
| *B82Y 40/00* | (2011.01) |

(52) U.S. Cl.
CPC .............. *B82Y 40/00* (2013.01); *H01M 4/366* (2013.01); *Y10S 977/843* (2013.01); *Y10S 977/897* (2013.01)

(56) References Cited

U.S. PATENT DOCUMENTS

| | | | |
|---|---|---|---|
| 4,664,939 A | | 4/1987 | Ovshinsky |
| 4,920,917 A | * | 5/1990 | Nakatani ................. C23C 16/52 118/718 |
| 5,268,062 A | * | 12/1993 | Darling, Jr. ........... C23C 16/545 427/122 |
| 6,090,505 A | | 7/2000 | Shimamura et al. |
| 6,258,408 B1 | | 7/2001 | Madan et al. |
| 6,869,484 B2 | | 3/2005 | Hunt et al. |
| 6,875,478 B2 | | 4/2005 | Yoshikawa et al. |
| 6,974,976 B2 | | 12/2005 | Hollars |
| 7,039,264 B2 | | 5/2006 | Bryan et al. |
| 7,384,680 B2 | | 6/2008 | Bi et al. |
| 7,521,097 B2 | | 4/2009 | Horne et al. |
| 7,575,784 B1 | | 8/2009 | Bi et al. |
| 7,816,031 B2 | | 10/2010 | Cui et al. |
| 8,257,866 B2 | | 9/2012 | Loveness et al. |
| 8,491,718 B2 | | 7/2013 | Chaudhari |
| 8,556,996 B2 | | 10/2013 | Loveness et al. |
| 8,637,185 B2 | | 1/2014 | Berdichevsky et al. |
| 9,172,088 B2 | | 10/2015 | Loveness et al. |
| 9,172,094 B2 | | 10/2015 | Loveness et al. |
| 9,780,365 B2 | | 10/2017 | Liu et al. |
| 2002/0028384 A1 | | 3/2002 | Krasnov et al. |
| 2002/0102461 A1 | | 8/2002 | Baker et al. |
| 2003/0178104 A1 | | 9/2003 | Sekine |
| 2004/0089237 A1 | | 5/2004 | Pruett et al. |
| 2004/0126659 A1 | | 7/2004 | Graetz et al. |
| 2004/0144314 A1 | | 7/2004 | David et al. |
| 2005/0175901 A1 | | 8/2005 | Kawakami et al. |
| 2007/0065720 A1 | | 3/2007 | Hasegawa et al. |
| 2007/0148544 A1 | | 7/2007 | Le |
| 2007/0240304 A1 | | 10/2007 | Eisenhardt et al. |
| 2008/0083612 A1 | * | 4/2008 | Wang .................... B82Y 30/00 204/192.15 |
| 2009/0061319 A1 | | 3/2009 | Kim et al. |
| 2009/0214944 A1 | | 8/2009 | Rojeski |
| 2009/0269511 A1 | | 10/2009 | Zhamu et al. |
| 2009/0288601 A1 | | 11/2009 | Bi et al. |
| 2010/0237272 A1 | | 9/2010 | Chaudhari |
| 2010/0285358 A1 | * | 11/2010 | Cui ....................... H01M 4/134 429/218.1 |
| 2010/0330421 A1 | | 12/2010 | Cui et al. |
| 2011/0027655 A1 | | 2/2011 | Rojeski |
| 2011/0111300 A1 | | 5/2011 | Delhagen et al. |
| 2011/0111304 A1 | * | 5/2011 | Cui .................... H01M 4/0421 429/231.8 |
| 2011/0143019 A1 | | 6/2011 | Mosso et al. |
| 2011/0159365 A1 | | 6/2011 | Loveness et al. |
| 2011/0189510 A1 | | 8/2011 | Caracciolo et al. |
| 2011/0287318 A1 | | 11/2011 | Loveness et al. |
| 2012/0070741 A1 | | 3/2012 | Liu et al. |
| 2012/0183856 A1 | | 7/2012 | Cui et al. |
| 2012/0251432 A1 | * | 10/2012 | Cooper ................ B01J 37/0215 423/447.3 |
| 2012/0301789 A1 | | 11/2012 | Loveness et al. |
| 2013/0344383 A1 | | 12/2013 | Loveness et al. |
| 2016/0013483 A1 | | 1/2016 | Loveness et al. |

FOREIGN PATENT DOCUMENTS

| | | |
|---|---|---|
| CN | 101560694 | 10/2009 |
| CN | 101561694 A | 10/2009 |
| CN | 101953014 | 1/2011 |
| JP | 2008305781 | 12/2008 |
| JP | 2013-521621 | 6/2013 |
| JP | 2012556203 | 6/2013 |
| WO | 2009/129490 | 10/2009 |
| WO | 2010/129910 | 11/2010 |
| WO | 2011/053553 | 5/2011 |
| WO | 2011/094642 | 8/2011 |
| WO | 2011/149958 | 12/2011 |
| WO | 2012/054767 | 4/2012 |

OTHER PUBLICATIONS

U.S. Final Office Action dated Dec. 13, 2013, issued in U.S. Appl. No. 12/637,727.
WO patent application No. PCT/US2011/026816, International Search Report and Written Opinion dated Oct. 18, 2011.
Cui, Li-Feng et al., "Crystalline-amorphous core-shell silicon nanowires for high capacity and high current battery electrodes," Nano Letters, 2009, vol. 9, No. 1 491-495, Dec. 23, 2008.
Carbon nanofiber product sheet, Applied Science 2008, downloaded from http://www.apsci.com/ngm-pyrol.html on May 2011.
WO patent application No. PCT/US2011/037767, International Search Report and Written Opinion dated Jan. 16, 2012.
WO patent application No. PCT/US2011/057159, International Search Report and Written Opinion dated Jun. 11, 2012.
Office Action dated Apr. 5, 2012 for U.S. Appl. No. 13/039,031.
Notice of allowance dated Jul. 26, 2012 for U.S. Appl. No. 13/039,031.
"Sweet nanotech batteries: Nanotechnology could solve lithium battery charging problems," PhysOrg.com, Received online Mar. 23, 2012 from http://phys.org/news127043619.html.
Lee et al., "Anomalous growth and characterization of carbon-coated nickel silicide nanowires," Chemical Physics Letters 384, 2004, pp. 215-218.
US Office Action dated Sep. 17, 2012 issued in U.S. Appl. No. 13/540,484.
Quasi-2D Structures Make Better Batteries, Tyrell, James, Apr. 17, 2008, pp. 1-2.
Nickel Silicide Nanobelts and Sheets in Li-ion Anodes Capacity, Green Car Congress, Apr. 19, 2009, pp. 1-3.
U.S. Appl. No. 13/540,484, Notice of Allowance dated Feb. 22, 2013.
U.S. Appl. No. 13/277,821, Office Action dated Feb. 25, 2013.
U.S. Appl. No. 13/277,821, Office Action dated Oct. 11, 2013.
Chaudhari, P. et al. "Heteroepitaxial silicon film growth at 600 degree C for an Al—Si eutectic melt," Thin Solid Films 518 (2010) 5368-5371.
Pre-Issuance Submission by Third Party dated Jan. 15, 2014, received in U.S. Appl. No. 13/914,491.
U.S. Appl. No. 13/277,821, Office Action dated Apr. 10, 2014.
U.S. Appl. No. 13/114,413, Office Action dated Jun. 19, 2014.
JP patent application No. 2012-556203, Office Action dated Aug. 26, 2014.
CN patent application No. 201180019460.3, Office Action dated Jul. 2, 2014.
U.S. Appl. No. 13/277,821, Final Office Action dated Nov. 20, 2014.
U.S. Appl. No. 13/914,491, Office Action dated Dec. 3, 2014.
U.S. Appl. No. 13/114,413, Notice to Allowance dated Jan. 22, 2015.

(56) References Cited

OTHER PUBLICATIONS

TW patent application No. 100120247, Office Action dated Feb. 9, 2015.
CN patent application No. 201180019460.3, Office Action dated May 6, 2015.
U.S. Appl. No. 13/114,413, Notice of Allowance dated Jun. 24, 2015.
JP patent application No. 2012-556203, Office Action dated Jul. 14, 2015.
U.S. Appl. No. 13/914,491, Notice of Allowance dated Jun. 19, 2015.
U.S. Appl. No. 13/277,821, Decision on Appeal dated Oct. 18, 2016.
CN patent application No. 11751259.0, Office Action dated Dec. 12, 2016.
U.S. Appl. No. 13/277,821, Notice of Allowance dated Jan. 4, 2017.
Sun et al, Synthesis of Nickel Mono-Silicide Nanowire by Chemical Vapor Deposition on Nickel Film: Role of Surface Nickel Oxides, Japanese Journal of Applied Physics, vol. 48, No. 4, Apr. 1, 2009, p. 84C138, XP855323364.
CN patent application No. 11751259.0, Extended Search Report dated Mar. 16, 2017.
CN patent application No. 201510674597.2, Office Action and Search Report dated Mar. 28, 2017.
JP patent application No. 2016-077671, Office Action dated Jul. 4, 2017.
U.S. Appl. No. 13/277,821, Notice of Allowance dated Jun. 1, 2017.
KR patent application No. 10-2012-7024928, Office Action dated Aug. 28, 2017.
U.S. Appl. No. 15/694,470, filed Sep. 1, 2017, Liu et al.

\* cited by examiner

DEPOSITION ON TWO SIDES OF A WEB

CROSS-REFERENCE TO RELATED APPLICATION

This application is a divisional of and claims priority to U.S. application Ser. No. 12/637,727, titled "APPARATUS FOR DEPOSITION ON TWO SIDES OF THE WEB," filed Dec. 14, 2009, all of which is incorporated herein by this reference for all purposes.

BACKGROUND

In conventional deposition apparatuses, the deposition process is performed only on one side of a substrate at a time. Another side is usually maintained in contact with a supporting surface, such as a roller or a flat plate, which may be used as a reference during deposition and/or to provide temperature control to the substrate. In some embodiments, the substrate is a web. A web may exert some pressure onto the supporting surface created by web tension and/or web weight. When two sided deposition is needed, a web is typically processed twice. Deposition is performed on one side first. The web is then rewound back through the same deposition station or fed through another deposition station to deposit on the other second side. As a result, processing time or equipment costs are doubled.

Further, during the second side deposition, the web with material already deposited on the first side is again exposed to process conditions, which may involve high temperature and/or reactive processing gases. The first side, which contacts the supporting surface under these conditions, often experiences substantial compressive and/or shear forces exerted by the supporting surface. Such approach may not be suitable for depositing fragile materials. For example, silicon nanowires may easily break when compressed or sheared at a temperature above 350° C. A first side deposited materials (e.g., an active electrode layer) may collapse or break during second side deposition and become unsuitable for use in batteries or other applications.

Methods and apparatuses are needed to deposit materials on both sides of a web in efficient ways while keeping materials deposited on both sides intact.

SUMMARY

Apparatuses and methods have been developed to feed a web in a substantially vertical direction through a deposition station and depositing various materials, such electrode component materials, on both sides of the web using a dry process technique. In particular embodiments, a web does not contact any hardware components during the deposition. In one example, however, a web may be supported before and/or after processing in the deposition station. Further, at its support points, the web may be exposed to conditions (e.g., temperature, gases) that are different from those in the deposition station. For example, a web may be cooled after the deposition and before contacting any hardware components. This allows depositing (and protecting from damage) materials that are fragile under deposition conditions, such an electrode active layer containing silicon nanowires. In addition to protecting deposited materials, this approach helps to increase an overall process throughput since only one pass through a deposition station is required.

An apparatus may include one or more deposition stations arranged to receive a web passing in a substantially vertical direction through the deposition apparatus. In certain embodiments, a deposition station may include a first port for delivering an electrode component material, or a precursor thereof, to a first side of the web as it passes through the deposition station. The station may also include a second port for delivering said electrode component material, or a precursor thereof, to a second side of the web as it passes through the deposition station. In some cases, the ports are designed to deliver materials employed in "dry" deposition processes such as CVD and PVD. Accordingly, dry process deposition may be performed on both sides of the web in the same station in a single pass. Typically, the apparatus is designed so that no hardware components come in physical contact with the web during deposition, while the web is passed through the deposition station.

A web may travel a vertical distance through the deposition station between two contact points that may be characterized as a multiple of the web width (e.g., at least about one times of the web width or, in more specific embodiments, at least about 3 times or even at least about 5 times). A residence time in the deposition station, which corresponds to duration of the dry deposition operation, is a function of the vertical distance and the web speed. In certain embodiments, the apparatus is designed to pass the web at a rate slower than about 1 meter per minute through a chamber that is least about 10 meters tall resulting in a residence/deposition time of at least about 10 minutes.

In certain embodiments, a method includes receiving a web at an inlet of a deposition apparatus, passing the web in a substantially vertical direction through a deposition station of the deposition apparatus and depositing material on both sides of the web via a dry process while the web passes in a substantially vertical direction through the deposition station, and removing the web from the deposition apparatus. In particular embodiments, when the web passes through the deposition station in the vertical direction during deposition of the material it does not physically contact any hardware components. The receiving the web may include unrolling a roll of a substrate. The removing the web may include winding the web onto a take-up roll. The dry process may include a chemical vapor deposition or a physical vapor deposition operation.

In certain embodiments, the deposited material includes electrode component material or, more specifically, electrochemically active material. The electrochemically active material may include nanoparticles. The nanoparticles may include silicon, which may be both in amorphous and crystalline forms. In particular embodiments, the nanoparticles include silicon nanowires. The electrode component material may include intermediate layer material that, in particular embodiments, functions as a barrier layer and/or a catalyst layer.

In certain embodiments, passing the web through the deposition station in the substantially vertical direction comprises feeding the web from a top of the deposition station to a bottom of the deposition station. The passing may involve feeding the web through the deposition station at a speed of between about 1 meter per minute and 3 meters per minute. Web's residence time in the deposition station may be at least about 5 minutes. In the same or other embodiments, the web's residence time is no greater than about 40 minutes.

The method may also include depositing one or more layers on the web prior to the web received at the inlet to the deposition apparatus. In the same or other embodiments, the method includes prior to passing the web through the deposition station, forming a mask or window on the web to exclude or promote, respectively, deposition of the material on the web. The web may be preheated prior to the passing the web through the deposition station. In the same or other embodiments, at least a portion of electrochemically active electrode material is deposited on the web prior to passing the web through the deposition station.

In certain embodiments, the method includes passing the web in the substantially vertical direction through a second deposition station of the deposition apparatus to deposit second material on the web. The second material may include electrochemically active electrode material. In particular embodiments, the electrochemically active electrode material deposited in the second deposition station includes lithium or amorphous silicon. Starting with the deposition of the material and until completion of the deposition the second material the web may not physically contact any hardware components. In particular embodiments, the method includes passing the web in the substantially vertical direction through a second deposition station of the deposition apparatus to deposit one or more materials selected from the group consisting of a battery electrolyte material and a polymer binder on the web. The web may be passed through a cooling station after passing the web through the deposition station.

The web received at the inlet may include copper, a copper alloy, nickel, a nickel alloy, steel, and combination thereof. The web received at the inlet may have a width of at least about 500 millimeters. The thickness of the web may be between about 5 micrometers and 50 micrometers.

In certain embodiments, a deposition apparatus includes a deposition station arranged to receive a web passing in a substantially vertical direction through the deposition station. The deposition station may include a first port or source for providing material, or a precursor thereof, to a first side of the web as it passes through the deposition station and a second port or source for providing said material, or a precursor thereof, to a second side of the web as it passes through the deposition station. The deposition station may be used to deposit the material on both sides of the web via a dry process while the web passes in the substantially vertical direction. In certain embodiments, the deposition station contains no components that physically contact the web during deposition of the material while the web passes in the vertical direction.

In certain embodiments, the deposition apparatus includes a web tension control mechanism arranged upstream from the deposition station. The web tension control mechanism may be configured for controlling web tension and speed during deposition in the deposition stations. The deposition apparatus may also include a mechanism positioned downstream from the deposition station for supplying a layer of interleaf material between web layers on a take-up roll. Specifically, the mechanism for supplying interleaf material may be configured to provide two layers of the interleaf materials on each side of the web.

In certain embodiments, the deposition apparatus includes a heating station configured to heat the web prior its entering the deposition station. In the same or other embodiments, the deposition station includes an in-situ heating element configured to heat the web during deposition.

The deposition station may be configured to contain a part of the web during deposition having a length of between about 2 meters and 20 meters. In the same or other embodiments, the part of the web contained in the deposition station during deposition has a length corresponding to at least one width of the web.

In certain embodiments, the deposition station is configured to deposit the electrode component material by a CVD or a PVD process. In the same or other embodiments, the deposition apparatus includes a second deposition station positioned downstream from the deposition station. The deposition station is configured to deposit the material by a thermal CVD process, while the second deposition station is configured to deposit second material by a PECVD process. More specifically, the deposition station is configured to deposit crystalline silicon nanowires, while the second deposition station is configured to deposit amorphous silicon.

In certain embodiments, the first port of the deposition apparatus comprises a gas distribution mechanism. The gas distribution mechanism may include a showerhead. The apparatus may include a buffer station arranged to prevent gases in the deposition station from other parts of the apparatus. In certain embodiments, the apparatus includes an inline metrology station for inspecting a web after it passes through the deposition station. The inline metrology station is configured to inspect weight per unit area of the deposited material. The apparatus may include a cooling station for cooling the web after it passed through the deposition station.

The material deposited in the deposition station may include electrode component material. In particular embodiments, the electrode component material includes electrochemically active electrode material.

These and other features and advantages of the disclosed apparatus and method will be presented below in more detail, with reference to the associated drawings.

DETAILED DESCRIPTION OF EXAMPLE EMBODIMENTS

Figure 1:
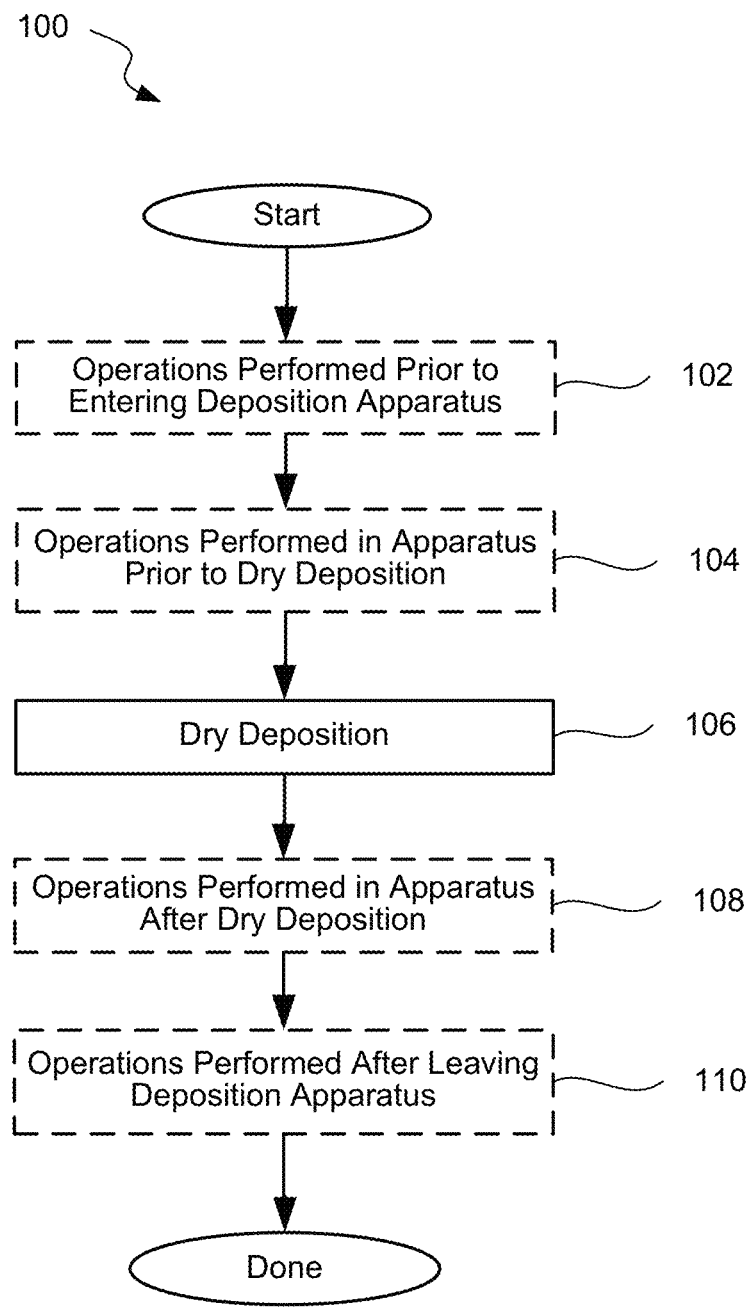
FIG. 1 illustrates an example of an overall process flowchart in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Certain applications, such as fabrication of battery electrodes, require depositing materials on both sides of a substrate. Typically, the substrate is supplied on a roll, which is unwound and processed to deposit materials and eventually fabricate battery electrodes. Unwound substrate is also referred to as a "web". A web is typically first passed through a deposition station where one or more electrode component materials are deposited. For example, in a conventional process, wet slurry prepared by mixing active material, binder, and optionally conductive additives with solvent (e.g., water, NMP) is coated on both sides (one at a time) of the moving web. After coating of the first side, the resulting coat is dried and the process is repeated to coat the other side.

Certain materials can be deposited using various dry process techniques. A "dry process" is defined in this document as a process that does not involve liquids coming in contact with a web during deposition. For example, a CVD technique with a liquid precursor is considered a dry process if, e.g., the precursor evaporates or is atomized prior to contacting the deposition surface. Therefore, dry deposition techniques do not include slurry coating, which is conventionally used to deposit active materials in lithium ion battery fabrication. However, an apparatus used for dry deposition may also include one or more station for slurry coating and/or other non dry processes. Examples of dry processes include Chemical Vapor Deposition (CVD), Physical Vapor Deposition (PVD), Atomic Layer Deposition (ALD), electrospinning, and aerosol spraying. For example, an electrochemically active layer containing silicon nanowires with crystalline cores and amorphous shells may be deposited on a conductive substrate using a combination of thermal CVD and Plasma Enhanced CVD (PECVD) and used for battery fabrication. In certain embodiments, methods and apparatus described in this document may used to deposit materials using techniques other than dry process techniques. For example, electrospinning and aerosol spraying techniques may involve a solvent that comes in contact with the substrate.

Dry processes have typically been used to deposit materials on only one side of the web at a time. Applications requiring a web with deposits on both sides have been limited. Two-sided deposits have been made by passing a web twice through one or more deposition stations. As stated above, such approach required additional processing (resulting in slower throughput) and additional web handling (increasing risk of damaging deposited materials and substrate).

In certain embodiments, a method of fabricating an electrode involves passing a web in a substantially vertical direction through a deposition station of the deposition apparatus and depositing electrode component material on both sides of the web via a dry process. In particular embodiments, the web does not contact any hardware components while passing through a deposition station. Further, the web may pass through two or more deposition stations in between two web-contact points. In particular embodiments, the web may have an intermittent support in between two successive deposition stations. For example, a roller may be used to align the web in between two stations and to prevent wobbling of the web. Such roller may apply minimal force on the web relative to other rollers in the apparatus and only nominally change the direction of the web (e.g., less than about 10° or, more specifically, less than about 5°).

Sometimes deposition on both side of the web coincide with each other. In other words, the starting and ending points within a deposition station are the same for both sides of the web. However, in certain embodiments, deposition on one side may start and/or end earlier than on the other side. In the same or other embodiments, deposition on one side may be completed before deposition on the other side starts. For simplicity, when deposition on both sides is performed in the same deposition station, deposition is said to be performed "at the same time" or "simultaneously" regardless of how the deposition zone on one side aligns with the deposition on the other side.

For the purposes of this application, "electrochemically active material" (or, simply, "active material") is defined as an electrode's component that provides electrochemically reactive sites (e.g., ion insertion sites). Each electrode in an electrochemical cell has at least one corresponding active material. In traditional lithium ion cells, a cathode active material is generally lithium cobalt oxide powder, lithium iron phosphate, etc., while an anode active material is generally graphite powder. In certain embodiments of the present invention, active materials are deposited as or formed into nanostructures, such as nanowires and include one or more of the following components: silicon, germanium, tin, tin oxide, and titanium oxide.

An "active layer" is an electrode layer that contains active material and, generally, does not include substrate. However, in some cases, boundaries between the active layer and the substrate are not sharp or abrupt. This may be the case, for example, where the substrate is or includes mesh or foam. In certain embodiments, conductive substrate may abut one or two active layers of the electrode. For example, active material may be deposited as nanowires onto a metallic foil forming an active layer in the contact with the metallic foil. In other embodiments, an active layer may intertwine with a substrate, such as mesh substrate or a substrate that is reconfigured after nanowires deposition. An active layer may also contain other components that are not active materials, such as conductive additives and binders, collectively referred to as "additives."

In certain embodiments, deposited materials are "substrate-rooted", which means that such materials are physically and conductively attached to a substrate. Additional examples and description of sub-rooted structures are provided in U.S. patent application Ser. No. 12/437,529 (published as 2010/0285358) entitled "ELECTRODE INCLUDING NANOSTRUCTURES FOR RECHARGEABLE CELLS" filed on May 7, 2009, which is incorporated herein by reference in its entirety for purposes of describing "substrate rooted" structures.

Deposition Process Examples

FIG. 1 illustrates an example of an overall process flow diagram in accordance with certain embodiments. The process 100 can be conceptually divided into operations performed prior to entering a deposition apparatus (block 102), operations performed in the deposition apparatus prior to dry deposition (block 104), a dry deposition operation (block 106), operations performed in the apparatus after dry deposition (block 108), and operations performed after leaving the deposition apparatus (block 110). Other than the dry deposition operations (operation 104), the listed operations are optional, i.e., operations 102, 104, 108, and 110. In one example, all web-processing operations may be performed in the apparatus, e.g., all operations from unwinding a web from the feeding roll to rewinding it with deposited material on the take-up roll, such that both rolls are included in the same apparatus. In this example, operations in groups 102 and 104 are not performed. Further, depending upon implementation designs, some operations that may normally be performed in one area can be performed, as well, in a different area. For example, unwinding a web from the feeding roll may be performed within an apparatus used for dry deposition and as such be categorized in group 104 or alternatively unwinding may be performed in a separate upstream apparatus of a larger system and as such be categorized in group 102. Generally, web processing concludes with the processed web being wound to a rewind roll or cut into plates or strips. However, a more encompassing process for battery fabrication may include other downstream operations, such as fabricating electrodes, winding electrodes strips into jellyrolls (or assembling into stacks), inserting subassemblies into cases, filling and sealing, performing formations cycles, and other operations.

An order of operations is reflected in the relative positions of different stations (or zones within the same station) arranged along the web travel direction. In other words, an order is specified with respect a specific position on a web, since the web is fed through an apparatus or a system.

Operations prior to dry deposition 106 can be performed either prior to entering an apparatus (block 102) containing the dry deposition station or within the apparatus (block 104). Whether an operation falls into one group or another generally depends on various features of the operation, such as processing environment (e.g., does the unwind operation need to be performed under vacuum) and web speed. For brevity, operations that can be performed upstream from the dry deposition operation 106 are described together (whether performed in the same apparatus as the deposition operation or a different apparatus) unless specifically noted. Further, unless specifically noted, both a discrete apparatus and a system containing multiple apparatuses are described together and generally referred to as an apparatus. Examples of specific distinctions are described in the context of FIG. 6.

Web processing generally starts with unwinding a substrate roll. A web is fed through an apparatus from a feeding roll to a take-up roll (or a mechanism that cuts the web lengthwise into plates or sheets). It should be noted that a web may be slit (i.e., cut lengthwise) into a set of strips that may be processed (e.g., wound on a take-up roll or cut into electrodes) similar to the full-width web.

In certain embodiments, threading and initial adjustments of the apparatus may be performed with a substrate that is different than used for other operations. For example, deposition may be performed on an expensive and/or fragile substrate that may not be suitable for threading and adjustment operations. Examples of various substrates are described below.

Once the web is threaded through the apparatus, various process parameters may be adjusted (e.g., pressure levels, temperatures, gas concentrations) before the web is fed for processing. From an unwinding roll, a web is typically passed through a tension control mechanism (further described in the context of FIG. 2 used to control tension and speed of the web. A web may also be inspected prior to processing with various in-situ metrology devices configured to measure its thickness, weight per unit area, surface roughness, color, and other parameters. In certain embodiments, threading is performed through a closed apparatus. An apparatus may be equipped with a threading mechanism that guides the front edge of the threaded web through the apparatus while it is closed.

In certain embodiments, a web is pre-treated prior to deposition. Examples of pre-treatment operations include pre-heating, cleaning, chemically or mechanically modifying substrate surface (e.g., to improve adhesion, to enhance or suppress deposition, to change surface roughness), depositing temporary or permanent intermediate layers. In particular embodiments, deposition is needed only on certain parts of the web surface, while other parts must be kept clear from any deposited materials or deposited materials must be easily removable from that areas. For example, a typical battery electrode has exposed substrate parts free from some or all deposited materials, which are used for, e.g., connecting to battery terminals. Intermittent deposition may be accomplished by stationary or moving shadow masks and/or intermittent treatment of the web surface prior to the deposition process to cause the desired areas of the web to more effectively receive the deposition than others. For example, a catalyst may be coated only in certain areas (e.g., that are not shadowed by a mask in a PVD process), so that electrode material deposition occurs in subsequent processes only where catalyst is deposited. Conversely, a mask or inhibitor material may be deposited in the negative of the desired pattern (i.e., excluding any materials from the areas where the mask is deposited), such that later deposition only occurs in the desired location where the mask is not present. In certain embodiments involving CVD techniques, a contact mask is used. A contact mask may be moved as a belt (or a loop) while contacting the web in the designated masked areas while the web is passing through the deposition area and lifting off after deposition is completed. Since certain areas of the web are covered by the solid portions of the mask while passing through the deposition zone, no or minimal deposition is performed in this area. As such, the contact between the mask and the substrate only occurs in the non-coated areas and may help to stabilize the web laterally (e.g., two mask belts positioned on each side of the web). In certain embodiments, mask material is deposited (e.g., sprayed) onto the surface of the web and then stripped after the web passes through the deposition station. In some embodiments (e.g., used for patterned deposition of silicon nanowires), a catalyst is deposited or de-activated in certain patterns such that minimal or no deposition is performed in the areas without any catalyst or where the catalyst has been deactivated. Patterned deposition and/or deactivation of the catalyst may be performed using one or more techniques described above.

In certain embodiments, two or more layers are deposited onto a web as a part of the deposition operation 106 or as a combination of this operation with an earlier deposition operation. Such layers may contain various types of materials, such as intermediate layers (e.g., catalyst layers, barrier layers, adhesion layers, electrochemically active materials, electrolytes, and separators. For example, a barrier layer may be deposited to protect the web during a CVD operation. An adhesion layer may be deposited to enhance mechanical integrity of the electrode.

As indicated, in some embodiments, the web may be pre-heated prior to the deposition operation 106. For example, a CVD process may require that the web be at a temperature of greater than about 300° C. In particular embodiments, the web is pre-heated to at least about 250° C. or, more specifically, to at least about 350° C. prior to entering into a deposition station. Heating may be performed in an inert environment to prevent substrate oxidation. Further, a pre-heating station may be positioned immediately before the deposition station to minimize heat losses in between. It should be noted that some heating may be performed in the deposition station itself. However, in order to optimize utilization of space in the deposition station, in-situ heating may be limited to temperature control (e.g., minimal heating, controlling temperature ensuring), while most of the heating is performed in a pre-heating station. Additional description of heater examples and feature is provided in the context of FIG. 2.

In certain embodiments, some or all of the active material is deposited onto the web prior to entering the deposition station. For example, active material may be deposited using wet coating (e.g., doctor-blade deposition of slurry containing electro-active nanoparticles). In another embodiment, a laser reactive deposition (LRD) technique may be used for depositing active materials. LRD techniques are also sometimes referred to as laser pyrolysis. The process may form columnar, fractal deposited structures. The process can be implemented by passing a high power laser beam into a reaction chamber containing a gaseous precursor. In particular embodiments, optical radiation strips hydrogen (or other atoms/moieties) off the precursor (e.g., silane) to form a plume of solid particles (e.g., silicon) which deposit on the surface below. The plume may be about 16-20 millimeters wide for some lasers. In one implementation, a slot nozzle is used to deliver the gas to the LRD region. Description of such techniques is provided in U.S. Pat. No. 7,575,784, issued on Aug. 18, 2009, U.S. Pat. No. 7,521,097 issued on Apr. 21, 2009, U.S. Pat. No. 7,384,680 issued on Jun. 10, 2008, and U.S. Pat. No. 7,039,264 issued on May 2, 2006, and US Patent Publication 2009/0288601 published on Nov. 26, 2009, all of which are incorporated herein by reference in their entirety for purposes of describing LRD techniques. Another example of active material deposition is ballistic deposition described in US Patent Publication No. 2004/0126659 published on Jul. 1, 2004, which is incorporated herein by reference in its entirety for purposes of describing ballistic deposition. A deposition station may be used to deposit other electrode component materials, such as binding or conductive additives, separator, and/or electrolyte.

As indicated, an overall process 100 may include one or more dry deposition operations 106. In certain embodiments, dry deposition operation involves a CVD process. For example, CVD may be used to deposit silicon containing nanoparticles or, more specifically, silicon containing nanowires onto a conductive substrate. Specific examples of silicon and other high capacity materials are described in U.S. patent application Ser. No. 12/437,529 entitled "Electrode Including Nanostructures for Rechargeable Cells" filed on May 7, 2009, which is incorporated by reference herein in its entirety for purposes of describing silicon and other high capacity materials. In particular embodiments, a process gas containing silane is introduced into the deposition station. Silane flow rate may be between about 10 sccm and 5,000 sccm for 1-meter wide substrate moving at a speed of about 1 meter per minute in a 1-20 meter long deposition zone. These parameters generally depend on the growth rate. While higher growth rate may be preferable, quality of the deposited materials and resulting battery performance may be unacceptable for such growth rates. In a particular embodiment, a web speed is about 1 meter per minute through a 5 meter deposition zone resulting in a 5 minute residence time. In other embodiments, residence time is between about 1 minute and 60 minutes or, more specifically between about 10 minutes and 30 minutes, which can be achieved by a taller deposition station and/or slower web speed. The web may be kept at between about 400° C. and 600° C. more specifically at about 500° C. Deposition station pressure may be kept at between about 1 Torr and 600 Torr. Other dry deposition processes that may be employed include Atomic Layer Deposition (ALD), Physical Vapor Deposition (PVD), and E-Beam deposition, and the like.

In certain embodiments, process parameters are kept uniform for the entire web surface positioned within the deposition station. In other embodiments, the process parameters are varied along the traveling direction of the web. For example, deposition parameters such as substrate temperature, process gas composition, plasma energy, and the like, may be adjusted from top to bottom in a deposition station. In a specific embodiment, such variations are employed to deposit silicon containing nanostructures with crystalline cores/amorphous shells in the deposition station. In certain embodiments, crystalline silicon nanowires are grown at about 500° C. in a process gas containing between about 1% to 100% molar concentration of silane by volume at a total pressure or between about 10 Torr and 600 Torr. The deposition time may vary from about 1 minute to about 30 minutes. Amorphous silicon coatings can be deposited at higher temperatures (e.g., at about 550° C.) and/or higher silane concentrations. Changing process parameters (increasing temperature and/or silane concentration) may create sidewall deposition during the crystalline growth process. In some embodiments, an amorphous silicon coating is added in a separate operation after completing deposition of the crystalline silicon structures. Amorphous silicon can be deposited using either thermal or plasma enhanced CVD. Examples of conditions for amorphous silicon PECVD include temperature of between about 200° C. and 400° C., pressure of between about 1 Torr and 100 Torr, and silane concentrations of between about 1% to 50% in either argon, nitrogen, helium, hydrogen, or various combinations thereof. Deposition of amorphous silicon may be performed for between about 30 seconds and 30 minutes. In certain embodiments, CVD is performed at pressure levels that are higher than 100 Torr, more specifically, at about atmospheric pressure or even slightly above atmospheric pressure. Higher pressure in the deposition chamber may help to improve deposition rates.

In particular embodiments, a part of the deposition station may be designated for thermal CVD and another part for PECVD (or some other dry deposition process such as a different thermal CVD process). Alternatively or in addition, a series of deposition stations may be arranged along the apparatus in the direction of web travel. Some of these stations may be devoted to one process and others to one or more different processes. The ratio of these parts (or the areas of the apparatus devoted to different processes) relative to the deposited web length may be between about 1:10 and 10:1 or, more specifically between about 1:1 and 10:1.

In certain embodiments, multiple dry deposition operations are performed in separate stations, each depositing additional material on the web. For example, one operation may be performed to form a core structure (e.g., a nanowire core). Another operation may follow to form one or more shells around the core. Core-shell structures used for battery electrode are described in details in U.S. Patent Application No. 61/181,637 entitled "Core-Shell High Capacity Nanowires for Battery Electrodes" filed on May 27, 2009, which is incorporated herein by reference in its entirety for purposes of describing core-shell structures. Further, materials that may be deposited concurrently or sequentially with an electrochemically active material include, e.g., lithium, carbon, silicide forming materials (e.g., cobalt, nickel, etc.), and the like. Additionally, conductivity enhancing materials such as carbon, lithium, and the like may be deposited concurrently or sequentially with the active material. In still other embodiments, a separator material may be dry deposited on the active material. For example, a polymer electrolyte may be deposited by either physical vapor deposition or from monomers by chemical vapor deposition.

In certain embodiments, lithium is added to compensate for losses such as SEI layer formation, etc. In some cases, lithium may be dry deposited by Atomic Layer Deposition (ALD), Physical Vapor Deposition (PVD), Chemical Vapor Deposition (CVD), and E-Beam techniques, and the like. In certain embodiments, lithium is added to the anode such that its amount corresponds to between about 5% and 50% of the theoretical capacity of the active material used on the anode or, more specifically, to between about 5% and 25% of that capacity. Once lithium is deposited, it may remain as elemental lithium (e.g., physically attached or in a form of an alloy) or react with other components in the electrode to form a chemical compound. In certain embodiments, lithium reacts with silicon in the anode active material to form silicides.

Process conditions may be selected to deposit materials with a desired weight per unit area. Usually, this is achieved by maintaining sufficiently high deposition rates and sufficient residence time in the deposition station. In particular embodiments, a silicon containing active material is deposited to a loading, defined as a weight per unit area, of between about 1 mg/cm$^2$ and 7 mg/cm$^2$ or, more specifically between about 3 mg/cm$^2$ and 5 mg/cm$^2$. In the same or other embodiments, a portion of the web that is within the deposition station has a length of between about 1 m and 20 m or, more specifically between about 5 m and 15 m. Further, in the same or other embodiments, a web speed is between about 0.1 m/min and 10 m/min or, more specifically, between about 0.5 m/min and 5 m/min. The residence time in the deposition station or, more specifically, in the deposition zone may be between about 1 min and 100 min or, more specifically, between about 5 min and 25 min.

In certain embodiments, dry deposition operation 106 involves a PVD technique, such as evaporation or sputtering. An entire apparatus or one or more stations of the apparatus are maintained at a pressure level of less than about 100 Torr or, more specifically, less than about 20 Torr. A web may be fed between two parts of the apparatus maintained at different pressure levels through a pressure differential station further described in the context of FIG. 2. For example, a PVD operation (e.g., depositing an intermediate layer) performed at a low pressure level may be followed in the same apparatus by a CVD operation (e.g., depositing an active layer) performed at a higher pressure, such that the web is fed through different pressure zones in the same apparatus.

A web passes through a deposition station in a substantially vertical direction either in an upward or downward direction. When an apparatus includes multiple deposition stations, a web may have the same feeding direction in all station or it may have different direction (upward and downward) in different stations. Factors for determining web direction in a particular station include fragility of deposited layers (at various points of contact with hardware elements), yield strength of the web and any additional strength provided by deposited layers, weights of substrate and deposited layers in a vertical span between two contact points, a length of the vertical span, and other factors. Some of these factors are further described below. It should be mentioned that deposition particularly fragile and/or heavy layers may require downward feeding through the deposition station.

In certain embodiments, as discussed above, deposition is performed on both sides of the web. In alternative embodiments, deposition is performed only on one side of the web. For example, end electrodes of a stacked cell require active layers only on one side of the substrate. Further, a protective layer may be applied to one side of the web before winding on take-up roll.

One-sided deposition may be performed in a deposition station arranged for a web to feed through the station without any physical contact with hardware elements of the station. In alternative embodiments, a web contacts on one side a supporting surface inside the station, while the deposition is performed on the other side. The supporting surface may be used to control temperature of the web (any deviations from setpoints and uniformity, both heating and cooling) and to support the web. Such support may help to prevent curling and reduce reliance on a web tension mechanism in order to maintain a flat deposition surface (and, thereby, reduce web tension that allows using thinner substrates) and any oscillations of the web in the vertical span created by foil feeding and delivering and removing process gases from the deposition station. The web may still be fed in a substantially vertical direction (as opposed to a traditional horizontal foil feeding) to minimize or eliminate any weight component of the force exerted by the web on the supporting surface the web to reduce friction, shear, or adhesion. Such approach may be useful when significant and rapid heat transfer and/or more precise control of a web position relative to the deposition station hardware components are needed during deposition. For example, substantial and, at the same time, more uniform heating may be required for catalyst layer de-wetting, islanding, and nucleation than, for example, can be achieved with laser ablation. Further, some heating technique, such as RF induction, may not be used on composite materials.

Turning now to operations that may be performed after dry deposition 106. Such operations may be performed in the same apparatus (block 108) or a different apparatus (block 110), such as another apparatus positioned downstream the feeding direction of the web. For brevity, the distinction between groups 108 and 110 is omitted unless specifically noted.

In certain embodiments, some or all active material is deposited after operation 106. For example, dry deposition may be used to deposit one or more intermediate layers and then active materials are deposited with wet slurry coating or some other deposition technique. In the same or other embodiments, a binder, conductive additives, and lithium containing materials are deposited into the web after operation 106. Lithium may be mechanically deposited as lithium metal nanoparticles, nano-dots, or a nano-powder, lithium foil and then integrated into the active materials (e.g., annealed. resputtered). As indicated, in certain embodiments, lithium is added to the anode such that its amount corresponds to between about 5% and 50% of the theoretical capacity of the active material used on the anode or, more specifically, to between about 5% and 25% of that capacity. Additional examples and description of lithium preloading are presented in U.S. patent application Ser. No. 12/944,593 entitled "PRELOADING LITHIUM ION CELL COMPONENTS WITH LITHIUM" filed on Nov. 11, 2010, which is incorporated herein by reference in its entirety for purposes of describing lithium pre-loading.

Further, post-dry-deposition operations may introduce separator and/or electrolyte materials onto one or both side of the web. For example, a polymer electrolyte may be deposited using CVD with monomer precursors or PVD with polymer precursors. In particular embodiments, electrolyte and/or separator materials are deposited onto the web before the web contacts any hardware components or wound onto the take-up roll. This may be done to protect fragile active layers formed earlier in the process. In other embodiments, electrolyte may be infused into the active layer (e.g., consisting of silicon nanowires and having high porosity).

In certain embodiments, a web with previously deposited materials may be annealed, for example, to establish bonds among deposited particles (e.g., nanowires) and/or between the particles and the substrate. Annealing may involve exposing a web to elevated temperatures (e.g., by passing through a heater), such as at least about 400° C. or, more specifically, at least about 500° C. In particular embodiments, a web with deposited material is passed through compression rollers that exert a constant pressure on the web or force the web through a constant gap. The rollers may be heated to at least about 80° C. or, more specifically, at least about 100° C.

Prior to winding a web to a take-up roll (or processing it in other ways, e.g., cutting into plates), the web may be cooled down. As mentioned above, cooling may be necessary to strengthen a deposited layer(s) prior to exerting pressure on this layer or contacting it to certain surfaces. In certain embodiments, a web is cooled down to below about 100° C. or, more specifically, below about 50° C.

While a web is wound onto a take-up roll, it may be interleaved with one or more other films (e.g., one on each side of the main web). Such films may be used to protect the deposits from damage due to surface shear in the winding process, as well as preventing blocking or sticking of the material on one deposited surface to another surface. In the case of battery electrodes, the separator film may be applied to one or both sides of the deposited web to allow for direct slitting and assembly from the roll. In particular embodiments, a separator film may be bonded to the web by, for example, light pressure and/or heat.

In certain embodiments, a web is processed in a roll-to-roll type of a process, i.e., the processed web is wound onto a take-up roll. Another web-tensioning mechanism (further described in the context of FIG. 2) may be positioned before the take-up roll. A roll may be used in subsequent battery fabrication processes, such as depositing additional layers, electrode slitting, winding/stacking, electrolyte filling, sealing, cell formation, and battery pack manufacturing. In some embodiments, the web is slit into strips, each representing a continuous web having a narrower width than the original web. For example, a width of each strip may correspond to a width of the electrode.

In other embodiments, a processed web is not wound onto a take-up roll and instead is cut into discreet plates. Such plates may be as wide as the original web or slit into strips (e.g., with a width and length corresponding to electrode dimensions). Plates or strips may be used directly in a winding/stacking operation or another operation in the overall battery fabrication process.

In some embodiments, a processed web in a roll or cut plate format is hermetically packed before removing from the apparatus. This approach allows maintaining web in a dry and clean state.

Some operations described above may be performed in such a way that there is no contact between the web and any hardware components while performing these operations. In certain embodiments, two or more operations are performed in a sequence without contacting hardware components.

Apparatus Features

Figure 2:
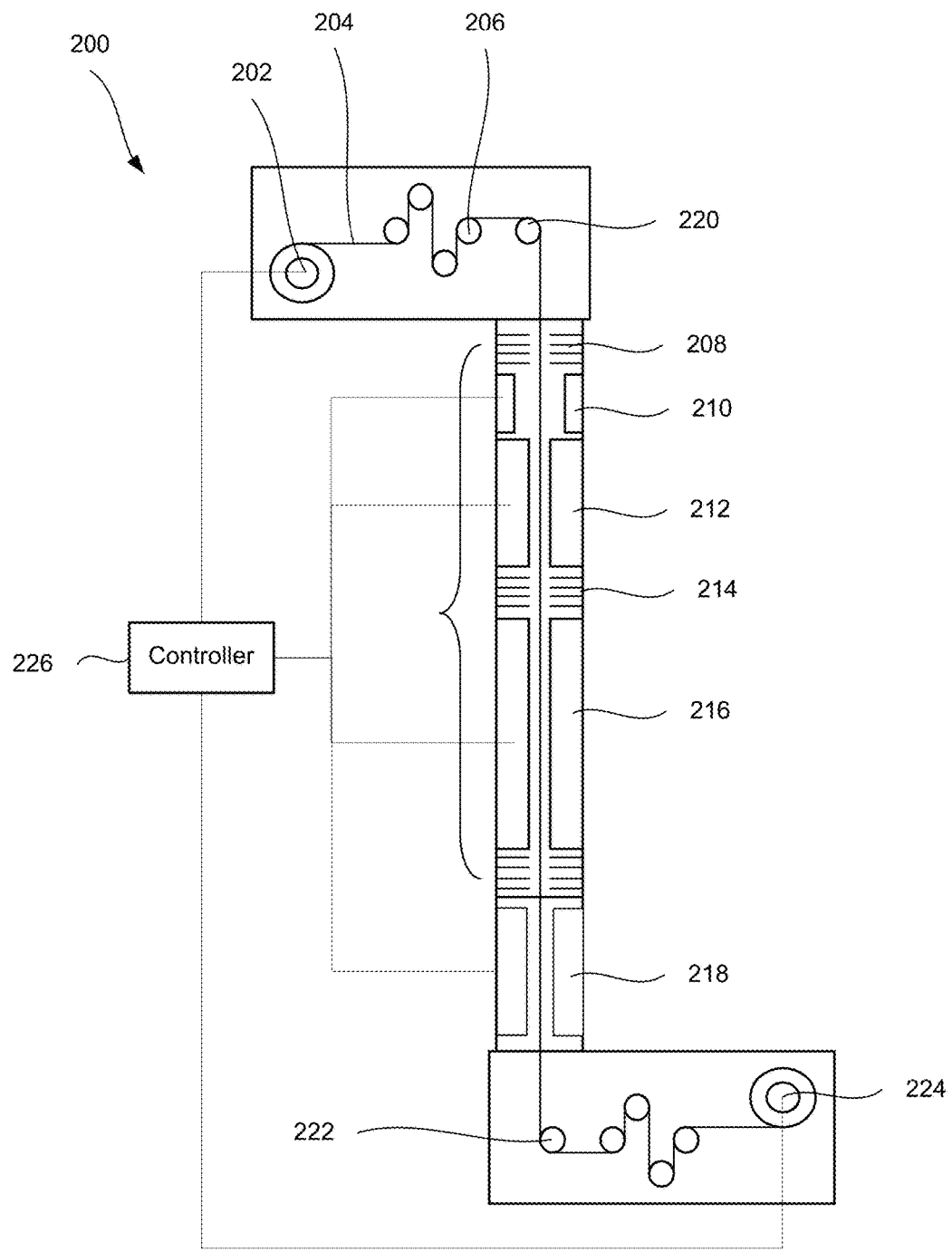
FIG. 2 illustrates an example of a deposition apparatus in accordance with certain embodiments.

FIG. 2 illustrates a deposition apparatus 200 in accordance with certain embodiments. An apparatus 200 may include a web feeding roll 202, which is sometimes also referred to as an unwind roll. The web 204 is unwound from the roll 202 by applying some force (tension) onto the web. In certain embodiments, a tension control mechanism 206 may be used to control tension during unwinding and web feeding operations. This mechanism is further described below. In order to create some tension as the web 204 unwinds from the roll 202, the roll 202 may have a friction mechanism (e.g., a mechanical break) that requires some force in order to rotate the roll 202 and unwind the web 204.

The substrate may be initially wound on a core (e.g., a metallic core, a paper core, or a plastic core) with an inner diameter (e.g., about 3 inches) corresponding to the feeding roll 202. In order to secure a substrate roll on the feeding roll 202, the feeding roll may be equipped with an air chuck or some other mechanism. The tension specified to be exerted on a web depends on substrate thickness and tensile strength of the material. While high tension may be desirable for web alignment with the apparatus, care should be taken to avoid substrate damage (e.g., stretching or ripping). It should be noted that, as indicated above, in at least a part of the apparatus, the web is fed in a substantially vertical direction.

From the feeding roll 202, the web 204 may pass through a tension control mechanism 206, which may include a set of rollers for controlling web tension, web alignment (to prevent web wrinkling, ripping, etc.), and its speed. In particular embodiments, one or more rolls in the tension control mechanism 206 can move to control the above described parameters. Tension control mechanism typically has an associated controller for adjusting the roller speeds, etc. as necessary to maintain a specified web tension.

In certain embodiments (e.g., high volume processes), accumulators are used at the unwind and rewind stations to allow changing of rolls without stopping web passing through the apparatus. Accumulators typically include a series of rolls the web is wrapped through, like a comb. To accumulate web, two groups of parallel rolls are moved apart to increase the amount of web that runs between alternating rolls as the rolls are moved apart. Tension and web speed through the process can be maintained by adjusting the speed of the unwind or rewind rolls as needed. When a roll change is needed, an unwind roll or a rewind roll is stopped and the accumulator rolls begin to move back together, reducing the hold-up of the web on the accumulator rolls. A new roll of web is spliced in or a new core is attached to the web coming off the re-wind accumulator. This can all be done without stopping the web through the process if there is sufficient web length in the accumulator to provide the time at process web speed to make the splice or core change.

Figure 3:
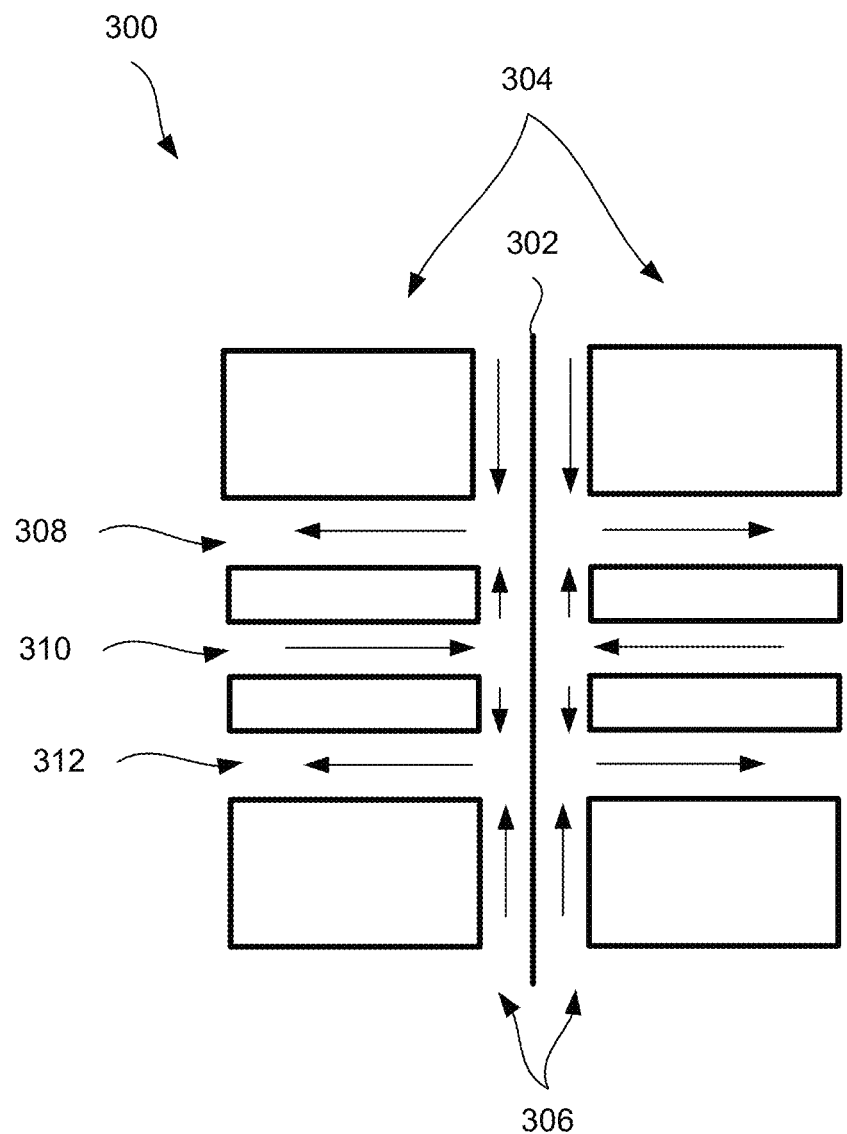
FIG. 3 illustrates an example of a buffer station in accordance with certain embodiments.

A web 204 may be then fed through a buffer station (208) or a buffer zone, which is used to prevent cross contamination of the two environments on each side of the station or zone. For example, web 204 may be unwound in an environment that is less clean than a deposition environment (e.g., an unwinding station may be used to clean the web from particles). Further, deposition station environment may contain gases that are not allowed in other stations. FIG. 3 presents a schematic representation of a buffer station 300 in accordance with certain embodiments. The web 302 is fed from one environment 304 (e.g., a thermal CVD station) into another 306 (e.g., a PECVD or cooling station). In order to prevent cross-contamination of the two environments a series of gas inlets and outlets is used. Flow directions in these inlets and outlets and other channels of the buffer station 300 are shown with arrows, in the depicted embodiment. In the illustrated example, the buffer station 300 has two exhaust ports 308 and 312 and one inlet port 310. As shown, gas flowing from environment 304 is combined with diluent (or buffer) gas flowing from inlet 310 and then the combined gas flows out of the exhaust port 308. Similarly, the gas flow from the environment 306 is combined with a diluent gas flow from the inlet 310 and the combined gas flows out of the exhaust port 310. Such flow patterns may be established by controlling pressure levels at different points of the buffer station. By flowing a buffer gas through an inlet in the direction of both environments any cross-contamination between the two is effectively mitigated. A simpler, but possibly less effective, example of a buffer station includes only one exhaust and no inlets where gases flown from the two environments are combined and removed from the single exhaust.

Returning to FIG. 2, the web 204 may be then fed through a pre-heating station 210. Examples of heating mechanisms for use in the station include heating rollers and/or surfaces, RF induction heaters for conductive substrates, IR and other types of radiant heaters, convective heaters with hot a fluid or gas, and laser beams. In some embodiments, the web 204 is exposed to a substantially inert environment in the pre-heating station 210 to prevent oxidation and other undesirable reactions. In certain embodiments, a heating station may be integrated into a same body with another station (e.g., a tension control mechanism or a deposition station).

The substrate 204 may then proceed into a deposition station 212. Examples of deposition processes include thermal CVD, PECVD, PVD, or any other method to promote a chemical reaction causing a component of the gas phase to react and deposit a material onto the web in the form of a film, particulate, or structured morphology (e.g., nanowire). In CVD station embodiments, the station 212 may have a process gas delivery system with a distribution device. Examples of distribution devices include a series of nozzles (e.g., parallel slot nozzles) and a showerhead. At least one distribution device may be positioned on each side of the web. In certain embodiments, the deposition station 212 has an integrated heater similar to ones described above. PVD stations are described in U.S. Pat. No. 6,974,976 issued on Dec. 13, 2005, which is incorporated herein by reference in its entirety for purposes of describing PVD apparatuses and techniques.

In a deposition station 212, the web is fed in a substantially vertical direction, which may be performed without contacting any hardware elements of the station. Stated another way, no support of the web is provided during deposition in the vertical deposition chamber.

Figure 4:
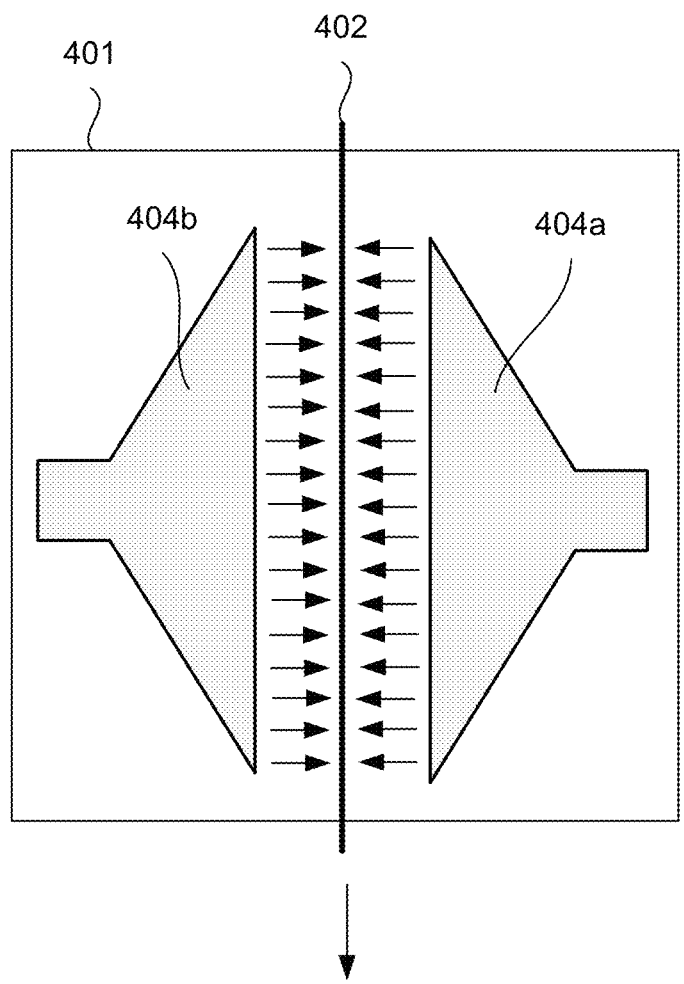
FIG. 4 illustrates an example of a deposition station in accordance with certain embodiments.

FIG. 4 illustrates an example of a deposition station 401 in accordance with certain embodiments. A web 402 is fed through a deposition station 401 in a substantially vertical direction (e.g., top to bottom as shown in FIG. 4). The web may pass between two ports or sources (404a and 404b) for providing material, or a precursor thereof, to each side of the web. In CVD embodiments, the ports 404a and 404b are showerheads or other process gas distribution devices. In PVD embodiments, the ports 404a and 404b are sputtering targets.

Returning to FIG. 2, in certain embodiments, two or more deposition stations may be positioned sequentially, one after another with intermediate buffering or other types of station in such a way that the web is fed through the entire set of the deposition stations without contacting any hardware components on the entire web span. FIG. 2 illustrates an example of this with a second deposition station 216 positioned along the vertical feeding direction of the web with the first deposition station 212 and separated from the first station 212 by another buffering station 214. The second (and any other subsequent) deposition station may be used to deposit the same or different materials over the first deposited material. It may employ the same (e.g., CVD and CVD) or different (e.g., CVD and PVD) deposition technique further described above. Further, the station may have different configuration (e.g., unsupported web length) and/or operate under different process parameters than the first station. In particular embodiments, one station may be used for thermal CVD (e.g., to deposit crystalline silicon cores) while another station may be used for PECVD (e.g., to form amorphous silicon shells on the crystalline cores). In certain examples, amorphous silicon provides binding/fusing among nanowires within the active layer and between the nanowires and the substrate.

Figure 5:
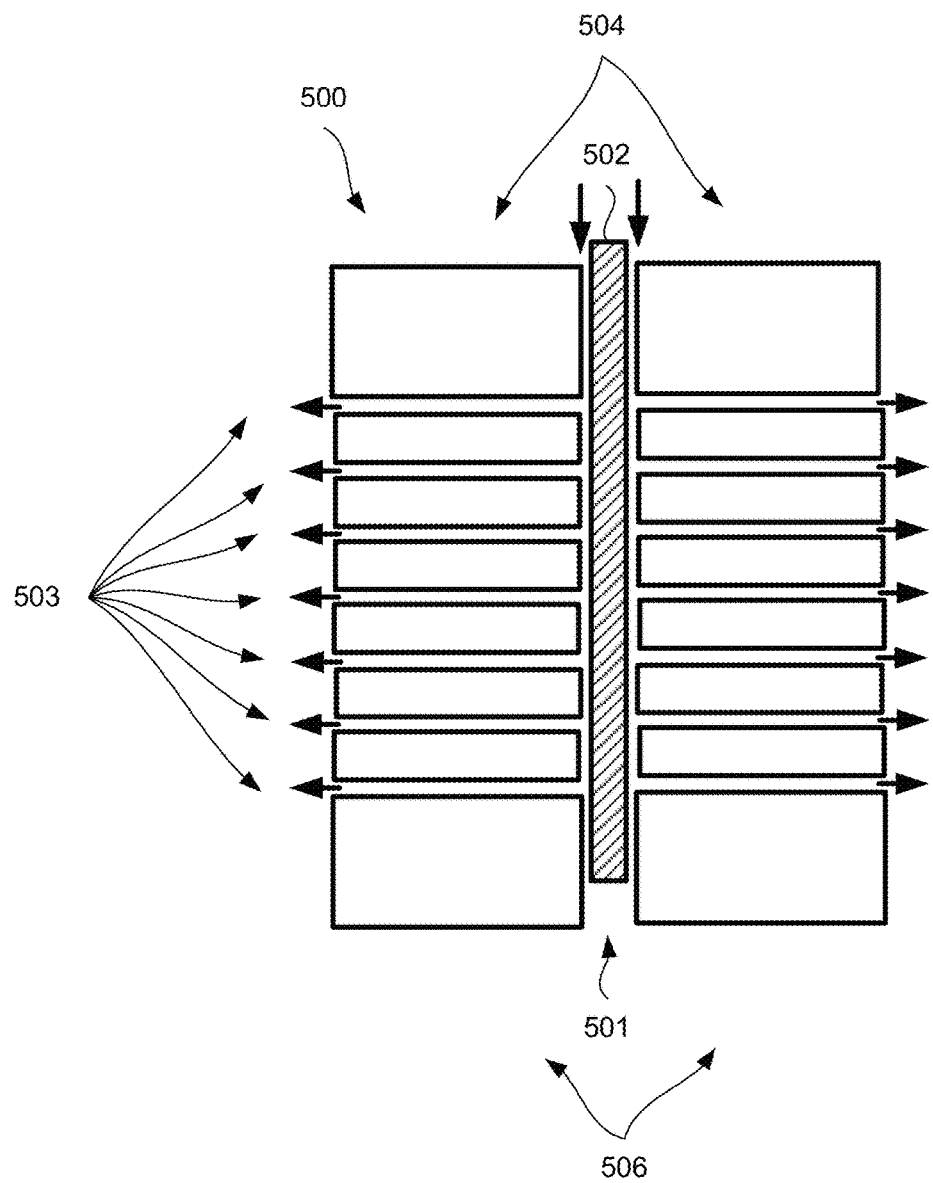
FIG. 5 illustrates an example of a pressure differential station in accordance with certain embodiments.

In certain embodiments, two deposition stations of the same apparatus operate at different pressure levels. This may require a pressure differential station, an example 500 of which is illustrated in FIG. 5. A pressure differential station may include a narrow tunnel 501 for feeding a web 502 though and a series of exhaust ports 503 to removing gases from the tunnel 501. The cross-sectional profile of the tunnel 501 may closely match the cross-section profile of the web 502 and be only slight larger to allow the web to be fed through. Such close match minimizes leaks from a high pressure environment 504 to a low pressure environment 506. All or most of the leaks from the high pressure environment 504 are removed through the exhaust ports 503. The length of the tunnel and flow rates through the exhaust may be configured in such a way that leaks to the low pressure chamber are minimized.

In certain embodiments, a web may be supported in between multiple stations (e.g., after each stations or a certain combination of stations). A support roller surface (whether for a standalone roller or for rollers that are parts of a tension control mechanism) may be specifically configured for web surfaces that contact this roller surface. For example, it has been found that nanowires deposited on a web can be come into contact and even be dragged across polymeric or non-metal ceramic or glass surfaces at room temperature without any substantial damage. On the other hand, contacting metal surfaces is believed to cause shearing of some nanowires from the web. While nanowire layers have some resilience to pressure as may occur during contact with a tension roller or during winding onto a take-up roll, in certain embodiments, the web is cut into plates immediately after deposition.

A vertical portion of the apparatus may be too large to be placed on a single floor of a building. In such situations, a portion of the apparatus may extend into a basement and/or upper floor of the building. An apparatus may also be designed in such a way that only a portion containing deposition stations extends above (e.g., into a tower) or below (e.g., into a well) of specifically designed for this building. In this configuration, both feeding and receiving rolls may be positioned on substantially the same vertical level.

A web may be fed through a metrology station where an entire or a portion of its width is inspected. Both contact and non-contact measuring techniques may be used. Examples of metrology equipment include optical scanners (e.g., laser that can be tuned to measure web thickness), ultrasonic gangues, beta/gamma/X-Ray probes, and other types of equipment. A metrology station may be positioned at different points along the web. For example, a metrology station may be positioned after each deposition station and its feedback is used to tune process parameters in the deposition station (e.g., change temperature, adjust web speed).

In certain embodiments, an apparatus 100 may include one or more cooling stations 218. A cooling station may be used to bring down the temperature of the web before exposing it a different environment or exerting force on the coating and/or substrate. For example, a silicon nanowire layer may be fragile close to its deposition temperatures, yet be able to support substantial forces when cooled down to the room temperature. A cooling may be performed by blowing (or otherwise circulating) a cold gas onto the web surfaces. Another example of cooling is by contacting the surface with a cold object (e.g., a soft surface without exerting any substantial pressure on the web).

At some endpoint in the process the web is wound onto a take-up roll 224, which is also referred sometimes referred as a rewind roll. Another tension control mechanism may be position before the take-up roll 224 or integrated into a take up roll. For example, a take-up roll may be driven by a drive that is configured to control its torque (e.g., by controlling power input or driving the roll through a clutch).

In certain embodiments, another web may be combined with the web processed in the apparatus prior to winding onto the take-up roll 224, i.e., an interleaf film. For example, a protective film may be introduced into the rewind roll to prevent contact between the two deposited layers (one on each side of the substrate) and damage of the layers.

In certain embodiments, a controller 226 is employed to control process conditions during in the apparatus. The controller 226 typically includes one or more memory devices and one or more processors. The processor may include a CPU or computer, analog and/or digital input/output connections, stepper motor controller boards, etc. In certain embodiments, the controller controls all of the activities of the deposition station. The controller executes control software including sets of instructions for controlling the timing of the processing operations, pressure, precursor flow rates, temperatures, plasma generator, etc. Typically, there will be a user interface associated with controller 226. The user interface may include a display screen, graphical software displays of the apparatus and/or process conditions, and user input devices such as pointing devices, keyboards, touch screens, microphones, etc.

The computer program code for controlling the processing operations can be written in any conventional computer readable programming language: for example, assembly language, JAVA, C, C++, Pascal, FORTRAN, or others. Compiled object code or script is executed by the processor to perform the tasks identified in the program. The controller parameters relate to process conditions such as, for example, timing of the processing steps, flow rates and temperatures of precursors and inert gases, temperature of the substrate, pressure of the chamber and other parameters of a process. These parameters are provided to the user in the form of a recipe, and may be entered utilizing the user interface. Monitoring the process may be provided by analog and/or digital input connections of the controller.

The software may be designed or configured in many different ways. For example, various chamber component subroutines or control objects may be written to control operation of the chamber components for carrying out the inventive deposition processes. Examples of programs or sections of programs for this purpose include substrate timing of the processing steps code, flow rates, and temperatures of precursors and inert gases code, and a code for pressure of the chamber.

Figure 6:
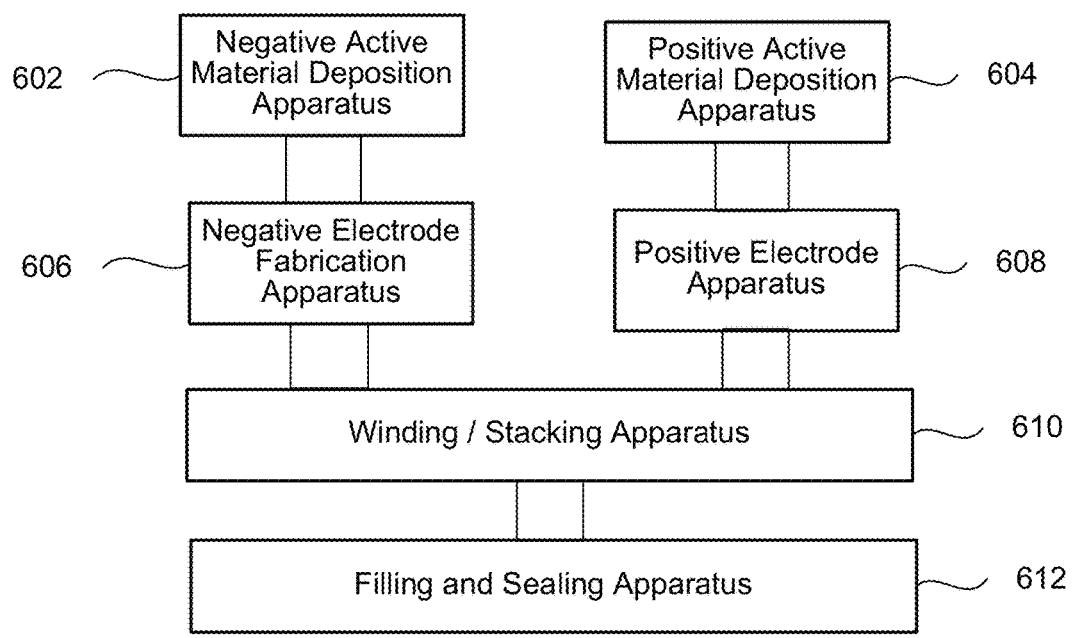
FIG. 6 illustrates an example of a battery fabrication system in accordance with certain embodiments.

Apparatuses and methods described above can be used in a system for fabricating electrochemical cells. FIG. 6 illustrates one example of such system 600. A system 600 may include a negative active material deposition apparatus 602 and a positive active material deposition apparatus 604. One or both of these apparatuses may have one or more deposition stations arranged to receive a web passing in a substantially vertical direction through the deposition stations. For example, negative active material containing silicon may be deposited onto substrate in a CVD station of the apparatus 602 and may form two active layers of silicon containing nanoparticles (e.g., silicon nanowires).

The system 600 may also include apparatuses 606 and 608 for fabricating electrode. For example, webs or strips with deposited active materials may be fed directly from the active material deposition apparatuses into the electrode fabrication apparatus. Electrode fabrication apparatus may be used to cut, press, form electrical connection with conductive substrates, and perform other electrode fabrication operations.

Once positive and negative electrodes are fabricated, they may be delivered to a winding or stacking apparatus 610. This apparatus may be used to align negative and positive electrodes, introduce separator and, in some embodiments, electrolyte, form electrical connections, position subassemblies into cases, and perform other jellyroll or stack fabrication operations. Jellyrolls or stacks are then delivered to a filling and sealing apparatus 612, which may be used to introduce liquid electrolyte into cells, if one is used, and seal the cells. Cells may then go through formation cycling and assembled into battery packs on apparatuses that are not illustrated in FIG. 6.

Materials

Substrates

In certain embodiments, a web is a conductive substrate that is used as a current collection in corresponding electrodes. Substrate materials may include copper and/or copper dendrite coated metal oxides, stainless steel, titanium, aluminum, nickel (also used as a diffusion barrier), chromium, tungsten, metal nitrides, metal carbides, carbon, carbon fiber, graphite, graphene, carbon mesh, conductive polymers, or combinations of above including multi-layer structures. It will be understood by one having ordinary skills in the art that selection of the materials also depends on electrochemical potentials of the materials. The substrate material may be formed as a foil, films, mesh, laminate, wires, tubes, particles, multi-layer structure, or any other suitable configurations. For example, the substrate may be a stainless steel foil having thickness of between about 1 micrometer and 50 micrometers. In other embodiments, the substrate is a copper foil with thickness of between about 5 micrometers and 30 micrometers.

Certain parameters and design considerations may drive selection of materials, morphologies, structural configurations of the substrate, e.g., tensile strength, Young's module, shear strength, surface roughness, surface activities, surface morphology, melting temperature, density, galvanic potential, passivation properties, cost, contact resistance, bonding compatibility with other metals, welding compatibility with different methods such as ultrasonic, resistance, and laser welding.

In some embodiments, a mesh can be used as a substrate. Meshes are generally characterized by a wire diameter, opening size, overall thickness, and weave type. For example, meshes having a wire diameter of between about 50 nm and 500 µm and an opening size of between about 50 nm and 500 µm may be used. Various weave types may be used, in particular ones that are expandable and can easily change configuration during battery cycling in order to minimize fluctuation of the overall electrode thickness and, maintain pressure to the nanostructures during full discharge to ensure electrical connectivity between various components of the electrode.

Substrates may have various degrees of roughness. Rough substrates, e.g. Ra of between about 1 micrometer and 50 micrometer, may be used to randomize the directions of nanostructure's orientation and to provide overlapping between the nanostructures (e.g., nanowires) in the active layer. Additionally, substrate roughness generally provides more surface area available for attachment or nucleation of nanostructures leading to a higher volumetric density of active nanostructures.

Rough surfaces may be achieved during substrate formation or during subsequent processing. For example, the surface roughness (Ra) of electroplated copper foil is generally between about 1 micrometer and 10 micrometers. Rolled copper foil has much lower roughness, generally less than 1 micrometer. Smooth surfaces may be roughened using various techniques, such as etching, blasting, brushing, and/or polishing. In certain examples, the substrate may be patterned or textured with channel-like structures, where the nanostructures extend from the surfaces of the channels towards each other. The nanostructures may also form connections between the two opposite surfaces of the same channel.

Electrical conductivity is another driver in substrate selection. Generally, conductive substrates are used in order to reduce the overall cell impedance. However, in some embodiments, electrically non-conductive materials may be used for the substrate 102. Such materials may be used for mechanical support and/or for insulating the active layer 203 of one electrode from another. In this instance, the electrical current flows through the active layer 203, which should, itself have high electrical conductivity. To this end, nanostructures may be interconnected, as further discussed below. In certain specific embodiments, an electrically non-conductive substrate may also function as a separator and provide a flow of lithium ions (i.e., provide ionic conductivity) between corresponding active layers of the anode and cathode.

In certain embodiments, substrate is a metallic foil with a thickness of at least 5 μm or, more specifically, at least about 10 μm. A thickness is generally determined by substrate's mechanical properties (e.g., flexibility, tensile stress) and electrical properties (e.g., conductivity). In particular embodiments, a copper foil with a thickness of between about 5 μm and 30 μm or, more specifically, between about 5 μm and 20 μm coated with nickel having a thickness of between about 0.5 μm and 2 μm is used. In other embodiments, a stainless steel foil with a thickness of between about 5 μm and 50 μm or, more specifically, between about 20 μm and 30 μm is used. Other examples of foil substrates are presented in the table below.

TABLE

| Material | Thickness Ranges, micrometers |
|---|---|
| Nickel | 5-50; 10-30 |
| Titanium | 5-25; 10-20 |
| Aluminum | 10-50; 20-30 |
| Copper | 5-50; 10-30 |

Another factor in a substrate selection process is substrates ability to withstand weights of the substrate and any deposited materials as well as any tension exerted by tension control mechanisms. Further, deposition is usually performed on the heated web, which may substantially affect its strength. For example, yield strength of pure copper drops almost tenfold when it is heated from 20° C. to about 500° C., which may be a temperature during a CVD process. While a copper foil can support its own weight of up to 400 m at this temperature, when a 5 mg/cm² coating is added on both side of a 10 μm copper foil it can only support of up to 200 m. Thicker coatings, higher deposition temperatures, and additional tension form the apparatus may require thicker substrates.

In certain embodiments, a substrate includes two or more materials and is referred to as a combination substrate. For examples, a base copper or nickel substrates may be deposited with a layer of tungsten, chromium, or nickel that is between about 1 nm and 100 nm thick. In the same or other embodiments, another layer containing gold, silver, copper, or mixture thereof is deposited over. This second layer may have a thickness of between about 1 nm and 100 nm. Such single or multiple layer configurations may be provided on one or both sides of the base substrate.

In certain embodiments, substrate has an open structure. Such substrate may take various forms including, for example, a porous block, foam, or mesh. Additionally, such substrate may be a perforated sheet or a rough sheet (e.g., a sheet having a roughness of at least about 0.1 μm $R_a$). In general, the solid portion of open structure substrate contains a plurality of openings such as, for example, voids, pores, cavities, punctures, and/or scratches. In certain embodiments, the substrate's ratio of surface area to volume (volume defined by an outer surface of the substrate that does not follow the contours defined by the void spaces) is greater than that of the corresponding solid version of the substrate (one having the same volume as the open structure). In certain embodiments, a substrate layer with open structures has a fractional void volume of at least about 10% or, more specifically, at least about 20%, at least about 30%, at least about 50%, at least about 60%, or at least about 70%, or at least about 90%, or at least about 95%. Additional examples and description of open structure substrates are presented in U.S. Pat. No. 8,637,185, entitled "OPEN STRUCTURES IN SUBSTRATES FOR ELECTRODES" issued on Jan. 28, 2014, which is incorporated herein by reference in its entirety for purposes of describing open structure substrates.

Electrochemically Active Materials

In certain embodiments, apparatuses and methods described above are used to deposit electrochemically active materials onto a web. Examples of electrochemically active materials include silicon containing materials (e.g., crystalline silicon, amorphous silicon, silicides, silicon oxides, sub-oxides, oxynitrides), tin-containing materials (e.g., tin, tin oxide), germanium, carbon-containing materials, a variety of metal hydrides (e.g., $MgH_2$), silicides, phosphides, and nitrides. Other examples include: carbon-silicon combinations (e.g., carbon-coated silicon, silicon-coated carbon, carbon doped with silicon, silicon doped with carbon, and alloys including carbon and silicon), carbon-germanium combinations (e.g., carbon-coated germanium, germanium-coated carbon, carbon doped with germanium, and germanium doped with carbon), and carbon-tin combinations (e.g., carbon-coated tin, tin-coated carbon, carbon doped with tin, and tin doped with carbon. Examples of positive electrochemically active materials include various lithium metal oxides (e.g., $LiCoO_2$, $LiFePO_4$, $LiMnO_2$, $LiNiO_2$, $LiMn_2O_4$, $LiCoPO_4$, $LiNi_{1/3}Co_{1/3}Mn_{1/3}O_2$, $LiNi_xCo_yAl_zO2$, $LiFe_2(SO4)_3$), carbon fluoride, metal fluoride, metal oxide, sulfur, and combination thereof. Doped and non-stoichiometric variations of these materials may be used as well. Examples of dopant includes elements from the groups III and V of the periodic table (e.g., boron, aluminum, gallium, indium, thallium, phosphorous, arsenic, antimony, and bismuth) as well as other materials (e.g., sulfur and selenium). In certain embodiments, one or more dopants have concentration of between about $10^{14}$ and $10^{19}$ atoms per centimeter cubed. In other embodiments, one or more dopants have concentration of between about $10^{19}$ and $10^{21}$ atoms per centimeter cubed. In yet another embodiment, concentration is between about $10^{21}$ and $10^{23}$ atoms per centimeter cubed.

A nanostructure may include different materials (both active and non-active) and distribution of these materials within the nanostructure may vary as well. For example, each material may form its own layer within a nanostructure. One example is a nanostructure where one material forms a "core" and another material forms a "shell" around the core. The nanostructure may have multiple shells. It should be understood that any number of concentric shells may be used. Furthermore, a core may be a hollow (e.g., tube-like) structure. Typically, at least one of the materials in a core-shell is an active material. In one embodiment, a core-shell structure forms nested layers in a rod or wire, where one layer is surrounded by another outer layer, e.g., forming a set of concentric cylinders. In other embodiments, each layer of the nanostructure is a sheet that is rolled around itself and other layers to form a spiral. For simplicity, each of these embodiments is referred to as a core-shell structure.

Particular examples of core-shell structures deposited with the above described methods and apparatus include: crystalline silicon core/amorphous silicon shell, nickel silicide core/amorphous silicon shell, carbon core/silicon shell, silicon core/carbon shell, and carbon core/silicon inner shell/carbon outer shell. More detailed description of core-shell structures is provided in U.S. patent application Ser. No. 12/787,168 entitled "CORE-SHELL HIGH CAPACITY NANOWIRES FOR BATTERY ELECTRODES" filed on May 25, 2010, which is incorporated herein by reference in its entirety for purposes of describing core-shell structures.

The outer shell may be designed to coat the inner shell and protect the inner shell from contacting an electrolyte (and forming a detrimental SEI layer), to allow electro-active ions to pass to and from the core, to improve electrical contacts among nanostructures in the active layer, to establish mechanical and/or electrical connection to the conductive substrate, if one is used, and/or other purposes. The thickness of the outer shell may be selected to provide one or more functions listed above. In certain embodiments, the thickness of the outer shell is between about 1 nanometer and 100 nanometers or, in more specific embodiments between about 2 nanometers and 50 nanometers.

In certain embodiments, materials deposited in processes described below are nanostructures, such as nanowires, nanospheres, nanocones, nanorods, nanoarcs, nanosaddles, nanoflakes, nanoellipsoids, and other shapes. Cross-sectional shapes are generally dependent on compositions, crystallographic structures (e.g., crystalline, amorphous), sizes, deposition process parameters, and many other factors. Shapes may also change during cycling. Irregularities of cross-sectional shapes require a special dimensional characterization. For the purposes of this application, a cross-section dimension is defined as a distance between the two most separated points on a periphery of a cross-section that is transverse to the principal dimension, such as length. For example, a cross-section dimension of a cylindrical nanorod circle is the diameter of the circular cross-section. In certain embodiments, a cross-section dimension of nanostructures is between about 1 nm and 10,000 nm. In more specific embodiments, a cross-section dimension is between about 5 nm and 1000 nm, and more specifically between 10 nm and 200 nm. Typically, these dimensions represent an average or mean across the nanostructures employed in an electrode.

In the same or other embodiments, an average length (or principal dimension) of the nanostructures is between about 1 micrometer and 100 centimeters or, in certain more specific examples, between about 1 micrometer and 10 millimeters, or even more specifically, between about 1 micrometer and 100 microns. Other ranges may include: between about 1 micrometer and 10 centimeters, between about 1 micrometer and 1 centimeter, between about 1 micrometer and 100 millimeters. Further, nanostructures interconnected in a mesh-like structure (e.g., carbon fiber paper) are generally described in terms of an average opening size, which could be between about 10 nanometers and 10 millimeters or, in more specific embodiments, between about 100 nanometers and 1 millimeter. An average length of nanostructures is generally driven by electrical conductivity and mechanical support considerations. For example, longer nanowires may form an interconnected network which may be provided in an electrode without a need for a conductive substrate.

In certain embodiments, a "nanowire" is defined as a structure that has, on average, an aspect ratio of at least about four. In certain examples, the average aspect ratio may be at least about ten, at least about one hundred, or even at least about one thousand. In some cases, the average nanowire aspect ratio may be at least about ten thousand, and can even reach about one hundred thousand. Nanowire active materials can undergo substantial swelling without disrupting the overall structure of the active layer, provide better electrical and mechanical connections with the layer, and can be easily realized using the vapor-liquid-solid and vapor-solid template free growth methods or other templated methods. Nanowires can be terminally rooted to the substrate to form an active layer as illustrated.

In certain embodiments, deposited electro-active materials define an active layer having certain properties, such as thickness and porosity. Porosity of an active layer is a measure of void spaces to the overall volume to the layer before the first cycle of the cell. For example, porosity of an anode is determined before any insertion of lithium ions occurs. It can be expressed as a percentage of the void volume to the total volume. In certain embodiments, the porosity of the active layer is at least about 10%, or more specifically at least about 20%, at least about 30%, at least about 40%, at least about 50%, or at least about 60%. In even more specific embodiments, the porosity may be at least about 75%, or more specifically at least about 90%. Greater porosity may allow more swelling of the nanostructures during cycling.

Other Materials

In certain embodiments, apparatuses and methods described above are used to deposit conductive additives on the web. Examples of conductive additives include carbonaceous material, such as coke, acetylene black, carbon black, Ketchen black, channel black, furnace black, lamp black and thermal black or carbon fibers, graphite, metallic flakes or particles of copper, stainless steel, nickel or other relatively inert metals, conductive metal oxides, such as titanium oxides or ruthenium oxides, or electronically-conductive polymers, such as polyaniline, polypyrrolein, polyvinylidine fluoride (PVDF), and carboxymethyl cellulose (CMC). The amount of conductive additive may be up to about 20 weight percent of the active layer, more specifically between about 1 are 10 weight percent.

In certain embodiments, apparatuses and methods described above are used to deposit intermediate layers onto a web prior to depositing electrochemically active materials. One or more intermediates layers may be used to protect the substrate from reactants used to deposit active materials, to facilitate deposition of active materials (e.g., contain a catalyst), to facilitate catalyst or active material distribution over the substrate surface (e.g., forming catalyst islands/nanowires), to enhance bonding between the substrate and active materials during deposition and operation of electrochemical cells, and other purposes. Additional examples and description of intermediate layers are presented in U.S. Application 61/260,297 entitled "INTERMEDIATE LAYERS FOR ELECTRODE FABRICATION" filed on Nov. 11, 2009, which incorporated herein by reference in its entirety for purposes of describing intermediate layers.

EXAMPLES

Figure 7:
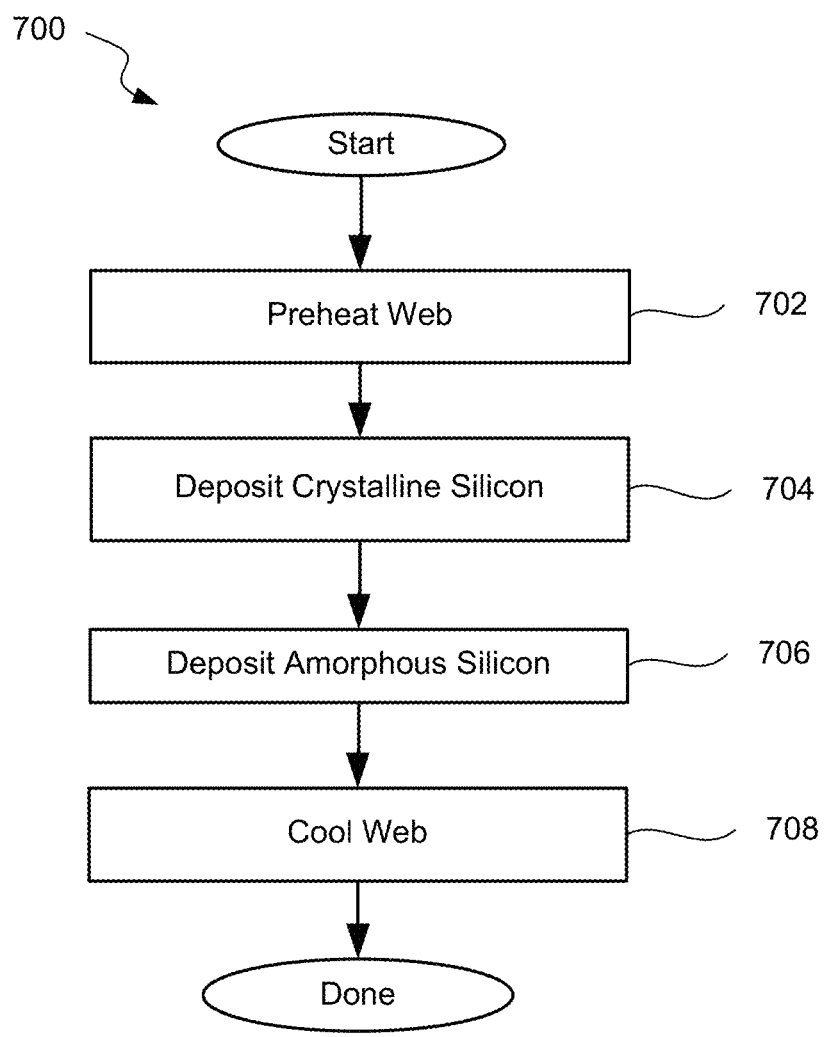
FIG. 7 illustrates a particular example of a process for depositing composite silicon active material.

FIG. 7 illustrates an example of a process 700 used for depositing substrate rooted silicon nanowires in apparatuses described above. The process 700 may start with preheating a web (block 702) to a predetermined temperature (e.g., at least about 400° C.). Crystalline silicon nanowires may be then grown on both sides of the web using thermal CVD (block 704). For example, silane mixed with hydrogen and inert diluents may be injected into the deposition station. The process may continue with PECVD, LACVD, or other deposition technique to coat the nanowires with amorphous silicon (block 706). For example, silane may be cracked in the gas phase by additional energy input (e.g., plasma) to promote very rapid deposition of onto the existing nanowire structures. The web may be then cooled down and feed to other stations for additional processing or wound onto a take-up roll. In particular embodiments, there is no contact between the web and any hardware elements of the apparatus during operations 704, 706, and 708.

In another example, a nickel foil or nickel-coated foil is reacted with silane to produce nickel silicide nanowires rooted to the foil surface using a thermal CVD technique. This operation may be followed by PECVD or similar high rate gas-phase cracking process for rapid deposition of silicon and deposition onto the pre-formed nickel silicide nanowire structures.

In yet another example, silicon particle may be deposited onto a web suing a slurry coating technique or a laser reactive deposition followed by thermal CVD or PECVD to deposit addition silicon containing materials to bond initial particles together.

In certain embodiments, an apparatus includes an unwind station to feed web from a roll to the inlet end of the deposition chamber. The inlet end may have a preceding buffer chamber to control atmosphere contamination or entrainment from the unwind part of the process. There may also be a pre-treatment chamber upstream of the CVD chamber to prepare the metal web to receive the coating. The deposition chamber(s) is oriented vertically so that the web travels through the chamber from top to bottom (or vice versa) without physical contact of the web with any supports, surfaces, rollers or the like as the web passes through the chamber(s). This non-contact approach allows for the deposition and formation of delicate structures without mechanical disturbance during and shortly after deposition, when the film morphology is vulnerable to damage. Similarly, there may be a buffer chamber and/or a cooling section following the deposition chamber(s) prior to the web entering the rewind station.

CONCLUSION

In addition to fabricating battery electrodes, the apparatuses and methods described herein may be used to fabricate other components, such as solar electrical panels, optical coatings, electrochromic materials, superconducting materials, fuel cell electrodes, flexible electronic substrates, electronic devices, and many other applications and devices.

Further, although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatuses of the present invention. Accordingly, the present embodiments are to be considered as illustrative and not restrictive, and the invention is not to be limited to the details given herein.

What is claimed is:

1. A method comprising:
   (a) receiving a continuous web at an inlet of a first deposition station and passing the web through the first deposition station; and
   (b) using a dry deposition process to produce nanowires rooted to the web surface on both sides of the web, wherein the nanowires are crystalline silicon.

2. The method of claim 1, wherein the dry deposition process comprises a chemical vapor deposition process or a physical vapor deposition process.

3. The method of claim 1, further comprising:
   (c) receiving the continuous web with rooted nanowires at an inlet of a second deposition station and passing the web through the second deposition station; and
   (d) using a dry deposition process to deposit a second material onto the nanowires on both sides of the web.

4. The method of claim 3, wherein the second material comprises electrochemically active material.

5. The method of claim 4, wherein the electrochemically active material comprises at least one of lithium and amorphous silicon.

6. The method of claim 3, wherein the second material comprises battery electrolyte material.

7. The method of claim 3, wherein the second material comprises polymer binder.

8. A method comprising:
   (a) receiving a continuous web at an inlet of a first deposition station and passing the web through the first deposition station; and
   (b) using a dry deposition process to produce nanowires rooted to the web surface on both sides of the web, wherein the nanowires are silicide nanowires.

9. The method of claim 8, wherein in passing the web through the first deposition station, the web does not physically contact any hardware components.

10. The method of claim 8, wherein the receiving the continuous web comprises unwinding a substrate web from a roll.

11. The method of claim 8, wherein the web is made of a material selected from the group consisting of copper, copper alloy, nickel, nickel alloy, and steel.

12. The method of claim 8, wherein the web has a width of at least about 500 millimeters.

13. The method of claim 8, wherein the web has a thickness of between about 5 micrometers and 50 micrometers.

14. The method of claim 8, wherein the dry deposition process comprises a chemical vapor deposition process or a physical vapor deposition process.

15. The method of claim 8, further comprising:
(c) receiving the continuous web with rooted nanowires at an inlet of a second deposition station and passing the web through the second deposition station; and
(d) using a dry deposition process to deposit a second material onto the nanowires on both sides of the web.

16. The method of claim 15, wherein the second material comprises electrochemically active material.

17. The method of claim 16, wherein the electrochemically active material comprises at least one of lithium and amorphous silicon.

18. The method of claim 15, wherein the second material comprises battery electrolyte material.

19. The method of claim 15, wherein the second material comprises polymer binder.

20. The method of claim 8, wherein the passing the web through the first deposition station comprises feeding the web through the first deposition station at a speed of between about 1 meter per minute and 3 meters per minute.

21. The method of claim 8, wherein a web residence time in the first deposition station is at least about 5 minutes.

22. The method of claim 8, wherein a web residence time in the first deposition station is no greater than about 40 minutes.

23. The method of claim 8, further comprising depositing one or more layers on the web prior to (a).

24. The method of claim 8, further comprising, prior to (a), forming a mask on the web to exclude or promote, respectively, deposition of nanowires on the web.

25. The method of claim 8, further comprising, prior to (a), preheating the web.

26. The method of claim 8, further comprising, prior to (a), depositing electrochemically active electrode material on at least a portion the web.

27. The method of claim 15, further comprising passing the web through a cooling station after one or more of (b) and (d).

* * * * *